(12) United States Patent
Lee et al.

(10) Patent No.: US 10,731,049 B2
(45) Date of Patent: Aug. 4, 2020

(54) COATING COMPOSITION AND COATING PANEL

(71) Applicant: SAMSUNG DISPLAY CO., LTD., Yongin-si, Gyeonggi-do (KR)

(72) Inventors: Soohoon Lee, Anyang-si (KR); Jaehwan Jeon, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 214 days.

(21) Appl. No.: 15/800,024

(22) Filed: Oct. 31, 2017

(65) Prior Publication Data

US 2018/0155572 A1    Jun. 7, 2018

(30) Foreign Application Priority Data

Dec. 2, 2016    (KR) .................. 10-2016-0163695

(51) Int. Cl.
*C09D 163/00*    (2006.01)
*C08G 59/24*    (2006.01)
*C08G 59/40*    (2006.01)
*C08G 59/50*    (2006.01)
*H05K 5/00*    (2006.01)
*H01L 51/00*    (2006.01)
*H05K 5/03*    (2006.01)
*H01L 51/52*    (2006.01)
*G02F 1/1333*    (2006.01)

(52) U.S. Cl.
CPC ......... *C09D 163/00* (2013.01); *C08G 59/245* (2013.01); *C08G 59/4028* (2013.01); *C08G 59/5086* (2013.01); *H01L 51/0034* (2013.01); *H01L 51/5246* (2013.01); *H05K 5/0017* (2013.01); *H05K 5/03* (2013.01); *G02F 1/133308* (2013.01); *G02F 2001/13332* (2013.01); *G02F 2001/133311* (2013.01); *G02F 2001/133314* (2013.01); *G02F 2201/50* (2013.01); *G02F 2202/022* (2013.01)

(58) Field of Classification Search
CPC .............. C08G 59/245; C08G 59/4028; C08G 59/5086; H01L 51/0034; H01L 51/5246; H05K 5/0017; H05K 5/03; C09D 163/00; G02F 2201/50; G02F 1/133308; G02F 2001/133314; G02F 2001/13332; G02F 2202/022; G02F 2001/133311
USPC ........................................................ 523/400
See application file for complete search history.

(56) References Cited

U.S. PATENT DOCUMENTS 5,739,216 A * 4/1998 Duecoffre .......... C09D 133/062
428/423.1
6,015,848 A * 1/2000 Ikushima ............... C08G 59/24
523/427

FOREIGN PATENT DOCUMENTS

| KR | 100848671 B1 | 7/2008 |
| KR | 100940754 B1 | 1/2010 |
| KR | 1020160078091 A | 7/2016 |

* cited by examiner

*Primary Examiner* — David T Karst
(74) *Attorney, Agent, or Firm* — Cantor Colburn LLP

(57) ABSTRACT

A coating composition including an epoxy resin in an amount of about 75 weight percent to about 80 weight percent; an isocyanate compound in an amount of about 10 weight percent to about 15 weight percent; and a melamine compound in an amount of about 5 weight percent to about 10 weight percent, where all weight percents are based on a total weight of the coating composition.

27 Claims, 6 Drawing Sheets

COATING COMPOSITION AND COATING PANEL

CROSS-REFERENCE TO RELATED APPLICATION

This application claims priority to and the benefit of Korean Patent Application No. 10-2016-0163695, filed on Dec. 2, 2016, in the Korean Intellectual Property Office, and all the benefits accruing therefrom under 35 U.S.C. § 119, the content of which is incorporated by reference herein in its entirety.

BACKGROUND

1. Field

Exemplary embodiments of the present disclosure relate to a coating composition and a coating panel including a coating film that includes the coating composition.

2. Description of the Related Art

A display device includes a chassis for protecting a display panel. The chassis may include metal or non-metallic materials, and a coating film may be formed on a surface of the metal or non-metallic materials to improve durability of the chassis.

In particular, since outdoor displays are exposed to extreme environments, the chassis should also be durable enough not to be damaged in extreme environments. Thus, there remains a need for a coating film for a display panel having excellent adhesiveness, strength and low brittleness.

SUMMARY

Exemplary embodiments of the present disclosure are directed to a coating composition and a paint composition capable of forming a coating film having excellent strength, adhesiveness and low brittleness.

Further, exemplary embodiments of the present disclosure are directed to a coating panel including a coating film having excellent strength, adhesiveness and low brittleness.

According to an embodiment, a coating composition includes: an epoxy resin in an amount of about 75 weight percent to about 80 weight percent; an isocyanate compound in an amount of about 10 weight percent to about 15 weight percent; and a melamine compound in an amount of about 5 weight percent to about 10 weight percent, where all weight percents are based on a total weight of the coating composition.

The epoxy resin and the isocyanate compound may be reactive to form a urethane bond.

The epoxy resin may include a bisphenol epoxy resin.

The epoxy resin may include a compound represented by the following Chemical Formula 1:

Chemical Formula 1

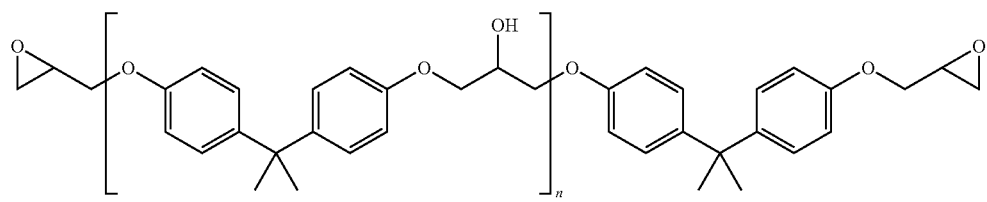

wherein, n is an integer from 1 to 100.

The isocyanate-based compound may include toluene diisocyanate, diphenylmethane 4,4'-diisocyanate, diphenylmethane 2,4' diisocyanate, hexamethylene diisocyanate, bis(4-isocyanatocyclohexyl) methane, isophorone diisocyanate, or a combination comprising at least one of the foregoing.

The isocyanate compound may include an adduct of isocyanate.

The adduct of isocyanate may include a compound represented by the following Chemical Formula 2, a compound represented by the following Chemical Formula 3, a compound represented by the following Chemical Formula 4, or a combination comprising at least one of the foregoing:

Chemical Formula 2

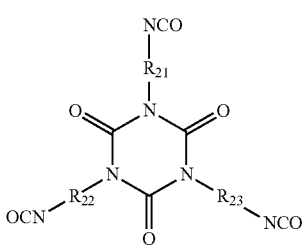

Chemical Formula 3

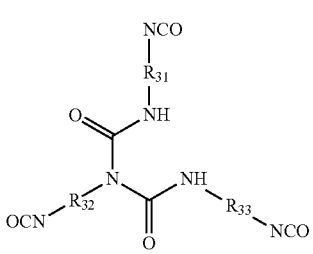

Chemical Formula 4

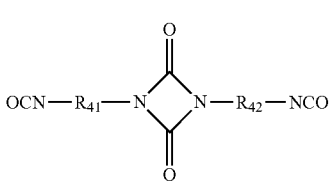

wherein, $R_{21}$, $R_{22}$, $R_{23}$, $R_{31}$, $R_{32}$, $R_{33}$, $R_{41}$ and $R_{42}$ are each independently a substituted or unsubstituted linear or cyclic hydrocarbon group having 1 to 30 carbon atoms.

The isocyanate compound may include a compound represented by the following Chemical Formula 5:

Chemical Formula 5

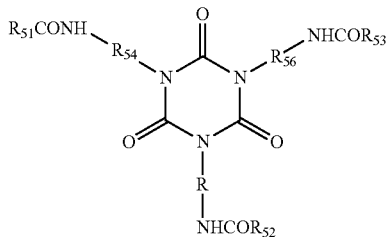

wherein, $R_{51}$, $R_{52}$, $R_{53}$, $R_{54}$, and $R_{56}$ are each independently a substituted or unsubstituted linear or cyclic hydrocarbon group having 1 to 30 carbon atoms.

The isocyanate compound may include a compound represented by the following Chemical Formula 6:

Chemical Formula 6

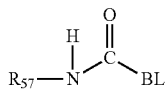

wherein, BL is a phenol group, an ε-caprolactam group, or a butanone oxime group; and $R_{57}$ is a substituted or unsubstituted linear or cyclic hydrocarbon group having 1 to 30 carbon atoms.

The melamine compound may include a compound represented by the following Chemical Formula 7:

Chemical Formula 7

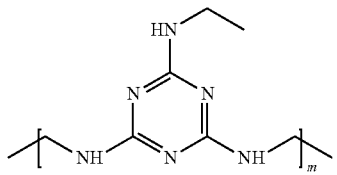

wherein, m is an integer from 1 to 100.

The melamine compound may include a compound represented by the following Chemical Formula 8:

Chemical Formula 8

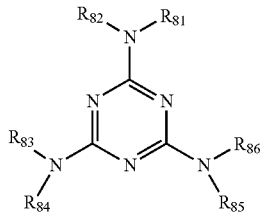

wherein, $R_{81}$, $R_{82}$, $R_{83}$, $R_{84}$, $R_{85}$ and $R_{86}$ are each independently a substituted or unsubstituted linear or cyclic hydrocarbon group having 1 to 30 carbon atoms.

According to another embodiment, a paint composition includes: a coating composition in an amount of 100 parts by weight; and a paint in an amount of about 5 parts by weight to about 10 parts by weight with respect to the 100 parts by weight of the coating composition, wherein the coating composition includes: an epoxy resin in an amount of about 75 weight percent to about 80 weight percent; an isocyanate compound in an amount of about 10 weight percent to about 15 weight percent; and a melamine compound in an amount of about 5 weight percent to about 10 weight percent, where all weight percents are based on a total weight of the coating composition.

According to still another embodiment, a coating panel includes: a base substrate; a first coating film disposed on the base substrate and including a first coating composition; and a second coating film disposed on the first coating film and including a second coating composition. The first coating composition includes: an epoxy resin in an amount of about 75 weight percent to about 80 weight percent; an isocyanate compound in an amount of about 10 weight percent to about 15 weight percent; and a melamine compound in an amount of about 5 weight percent to about 10 weight percent, where all weight percents are based on a total weight of the first coating composition.

The base substrate may include stainless steel.

The second coating composition may be substantially the same as the first coating composition.

The second coating composition may include: the first coating composition in an amount of 100 parts by weight; and a paint in an amount of about 5 parts by weight to about 10 parts by weight with respect to the 100 parts by weight of the first coating composition.

According to yet another embodiment, a display device includes: a display panel; and a chassis protecting the display panel and including a coating panel, wherein the coating panel includes: a base substrate; a first coating film disposed on the base substrate and including a first coating composition; and a second coating film disposed on the first coating film and including a second coating composition. The first coating composition including: an epoxy resin in an amount of about 75 weight percent to about 80 weight percent; an isocyanate compound in an amount of about 10 weight percent to about 15 weight percent; and a melamine compound in an amount of about 5 weight percent to about 10 weight percent, where all weight percents are based on a total weight of the first coating composition.

The display panel may be a liquid crystal display panel.

The display panel may be an organic light emitting diode display panel.

The foregoing is illustrative only and is not intended to be in any way limiting. In addition to the illustrative aspects, exemplary embodiments, and features described above, further aspects, exemplary embodiments, and features, in part, will become apparent by reference to the drawings and the following detailed description, or may be learned by practice of the presented exemplary embodiments.

BRIEF DESCRIPTION OF THE DRAWINGS

These and/or other aspects will become more apparent and more readily appreciated from the following description of exemplary embodiments, taken with reference to the accompanying drawings, wherein.

DETAILED DESCRIPTION

Figure 1:
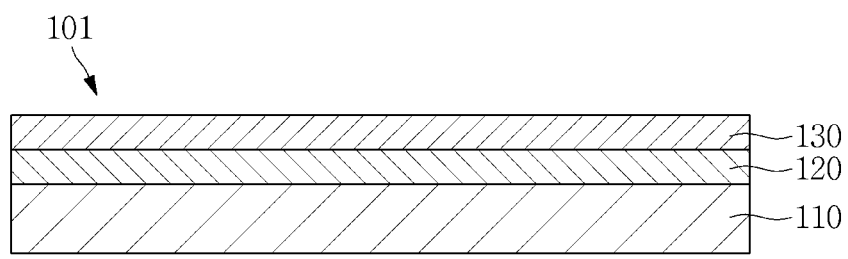
FIG. 1 is a cross-sectional view illustrating a coating panel according to an embodiment.

Exemplary embodiments will now be described more fully hereinafter with reference to the accompanying drawings. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

In the drawings, thicknesses of a plurality of layers and areas are illustrated in an enlarged manner for clarity and ease of description thereof. When a layer, area, element, or plate is referred to as being "on" another layer, area, element, or plate, it may be directly on the other layer, area, element, or plate, or intervening layers, areas, elements, or plates may be present therebetween. Conversely, when a layer, area, element, or plate is referred to as being "directly on" another layer, area, element, or plate, there are no intervening layers, areas, elements, or plates therebetween. Further when a layer, area, element, or plate is referred to as being "below" another layer, area, element, or plate, it may be directly below the other layer, area, element, or plate, or intervening layers, areas, elements, or plates may be present therebetween. Conversely, when a layer, area, element, or plate is referred to as being "directly below" another layer, area, element, or plate, there are no intervening layers, areas, elements, or plates therebetween.

The spatially relative terms "lower" or "bottom" and "upper" or "top", "below", "beneath", "less", "above", and the like, may be used herein for ease of description to describe the relationship between one element or component and another element or component as illustrated in the drawings. It will be understood that the spatially relative terms are intended to encompass different orientations of the device in use or operation, in addition to the orientation depicted in the drawings. For example, in the case where a device illustrated in the drawings is turned over, elements described as being on the "lower" side of other elements, or "below" or "beneath" another element would then be oriented on "upper" sides of the other elements, or "above" another element. Accordingly, the illustrative term "below" or "beneath" may include both the "lower" and "upper" orientation positions, depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below, and thus the spatially relative terms may be interpreted differently depending on the orientations described.

Throughout the specification, when an element is referred to as being "connected" to another element, the element is "directly connected" to the other element, or "electrically connected" to the other element with one or more intervening elements interposed therebetween.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an idealized or overly formal sense unless expressly so defined in the present specification.

Exemplary embodiments are described herein with reference to cross section illustrations that are schematic illustrations of idealized embodiments, wherein like reference numerals refer to like elements throughout the specification. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims. Some of the parts which are not associated with the description may not be provided in order to specifically describe exemplary embodiments of the present disclosure.

An exemplary embodiment provides a coating composition.

The coating composition according to an embodiment may be used to coat a substrate including a metal or a non-metal. A coating film formed using the coating composition according to an embodiment has excellent adhesiveness and durability, and low brittleness.

The coating composition according to an embodiment includes, with respect to a total weight of the coating composition, an epoxy resin in an amount of about 75 percentage by weight (weight percent, wt %) to about 80 wt %, an isocyanate compound in an amount of about 10 wt % to about 15 wt %, and a melamine compound in an amount of about 5 wt % to about 10 wt %.

The epoxy resin of the coating composition can serve as a binder resin.

When the content of the epoxy resin in the coating composition is relatively small, an amount of the isocyanate compound and the melamine compound, acting as a curing agent, increases, and thus the curing degree of the coating composition increases, but the brittleness of a coating film formed using the coating composition increases. Accordingly, the coating film may be undesirably broken or cracked. On the other hand, when the content of the epoxy resin in the coating composition is relatively large, the amount of the isocyanate compound and the melamine compound, acting as the curing agent, decreases, and the curing degree of the coating composition may be reduced.

Accordingly, in an embodiment, the epoxy resin is present in an amount of about 75 wt % to about 80 wt % with respect to the total weight of the coating composition.

There is no particular limitation on the kind of the epoxy resin. An example of the epoxy resin may include a bisphenol epoxy resin, and in particular, a bisphenol A epoxy resin may be used. For example, the epoxy resin may include a compound represented by the following Chemical Formula 1.

200 to about 20,000 grams per mole (g/mol) and a degree of polymerization ranging from about 0.1 to about 5.5 may be used. When the weight average molecular weight of the silane-modified epoxy resin is less than about 200 g/mol, the viscosity of the composition can be too low and the resulting mechanical strength of the coating film is relatively low. When the silane-modified epoxy resin has a weight average molecular weight of greater than about 20,000 g/mol, the viscosity of the composition can be too large to provide a uniform coating film. Accordingly, a silane-modified epoxy resin having a weight average molecular weight ranging from about 200 to about 20,000 g/mol may be used.

According to an embodiment, the epoxy resin has a hydroxyl group (OH) and is reactive with an isocyanate compound to form a urethane bond.

The formation of the urethane bond may be represented by the following Reaction Formula 1.

R—NCO+R'—OH→R—NH—CO—O—R'    Reaction Formula 1

In Reaction Formula 1, R—NCO represents an isocyanate compound, and R'—OH represents an epoxy resin.

By such urethane bonding, the coating composition according to an embodiment has excellent flexibility and elasticity, and may have a strong bonding force with an adherent. For example, a urethane bond formed between an epoxy resin and an isocyanate compound may have a strong bonding force with a stainless steel substrate to which it is adhered. In addition, since the coating film formed using the coating composition can have a urethane bond, the brittleness of the coating film can be reduced to prevent cracking or breakage of the coating film.

The isocyanate compound can improve the elasticity of the coating film formed using the coating composition, and can increase the bonding force between the coating composition and the adherent. The isocyanate compound may act as a curing agent together with the melamine compound.

Chemical Formula 1

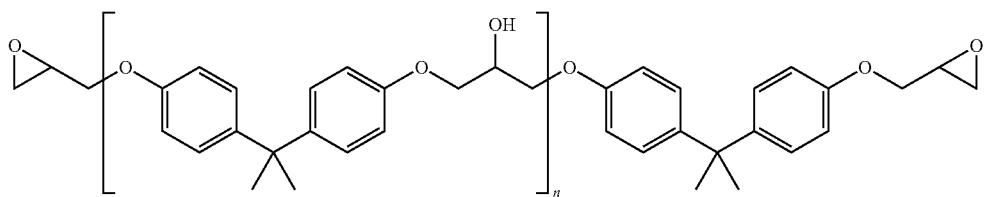

In Chemical Formula 1, n is an integer from 1 to 100.

However, embodiments are not limited thereto. A silane-modified epoxy resin, for example, may be used as the epoxy resin.

The silane-modified epoxy resin may be produced, for example, by reacting an alkoxysilane with a monomer containing an epoxy group. Examples of the monomer containing an epoxy group may include epichlorohydrin, epibromohydrin, epiyodohydrin, 1-chloro-3,4-epoxybutane, ethylene oxide, propylene oxide, isobutylene oxide, methyl glycityl ether, ethyl glycidyl ether, isopropyl glycidyl ether, or the like. Examples of the alkoxysilane may include methoxysilane, ethoxysilane, isopropoxysilane, or the like.

A silane-modified epoxy resin may be, for example, a silane-modified epoxy resin produced by reacting epichlorohydrin with methoxysilane.

For example, a silane-modified epoxy resin having a weight average molecular weight ($M_W$) ranging from about According to an embodiment, the content of the isocyanate compound in the coating film is not particularly limited. However, when the content of the isocyanate compound is relatively small, the flexibility and elasticity of the coating film formed using the coating composition may be lowered and the brittleness may be increased. When the content of the isocyanate compound is relatively large, the strength and hardness of the coating film formed using the coating composition may be lowered.

Accordingly, the isocyanate compound is present in an amount of about 10 wt % to about 15 wt % with respect to the total weight of the coating composition.

There is no particular limitation on the kind of the isocyanate compound. According to an embodiment, the isocyanate compound may include toluene diisocyanate (TDI), diphenylmethane 4,4'-diisocyanate (MDI), diphenylmethane 2,4' diisocyanate, hexamethylene diisocyanate (HDI), bis (4-isocyanatocyclohexyl) methane, isophorone diisocyanate (IPDI), or a combination comprising at least one of the foregoing.

In another embodiment, an adduct of an isocyanate that is derived from an isocyanate compound, for example a diisocyanate, may be used. The adduct of isocyanate may be a compound represented by the following Chemical Formula 2, a compound represented by the following Chemical Formula 3, a compound represented by the following Chemical Formula 4, or a combination comprising at least one of the foregoing.

Chemical Formula 2

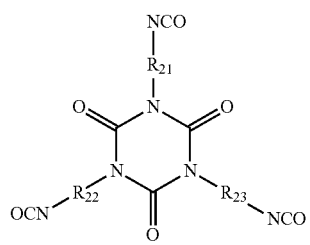

Chemical Formula 3

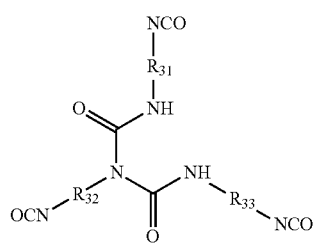

Chemical Formula 4

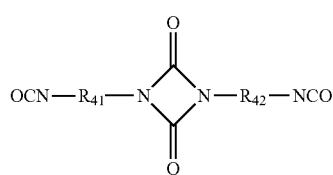

In Chemical Formulae 2, 3 and 4, $R_{21}$, $R_{22}$, $R_{23}$, $R_{31}$, $R_{32}$, $R_{33}$, $R_{41}$ and $R_{42}$ are each independently a substituted or unsubstituted linear or cyclic hydrocarbon group having 1 to 30 carbon atoms.

The compound of Chemical Formula 2 is an isocyanate adduct in the form of a trimer and is also referred to herein as an isocyanurate.

The compound of Chemical Formula 3 is also referred to herein as a biuret.

The compound of Chemical Formula 4 is an isocyanate adduct in the form of a dimer, and is also referred to herein as an uretdione.

In still another embodiment, a blocked isocyanate compound represented by the Chemical Formula 5, may be used as the isocyanate compound.

Chemical Formula 5

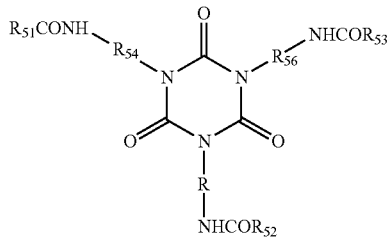

In Chemical Formula 5, $R_{51}$, $R_{52}$, $R_{53}$, $R_{54}$, and $R_{56}$ are each independently a substituted or unsubstituted linear or cyclic hydrocarbon group having 1 to 30 carbon atoms.

In yet another embodiment, a blocked isocyanate compound represented by the Chemical Formula 6 may be used as the isocyanate compound.

Chemical Formula 6

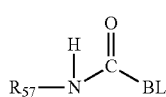

In Chemical Formula 6, BL is a phenol group, an ε-caprolactam group, or a butanone oxime group; and $R_{57}$ is a substituted or unsubstituted linear or cyclic hydrocarbon group having 1 to 30 carbon atoms.

The melamine compound can improve the hardness and mechanical strength of the coating film that is formed using the coating composition. The melamine compound may act as a curing agent together with the isocyanate compound.

According to an embodiment, the amount of the melamine compound in the coating composition is not particularly limited. However, when the content of the melamine compound is relatively small, the strength and hardness of the coating film formed using the coating composition may be lowered. On the other hand, when the content of the melamine compound is relatively large, the flexibility and elasticity of the coating film formed using the coating composition may be lowered and the brittleness may be increased.

Accordingly, the melamine compound is present an amount of about 5 wt % to about 10 wt % with respect to the total weight of the coating composition.

There is no particular limitation on the kind of the melamine compound. According to an embodiment, a melamine resin represented by the Chemical Formula 7 may be used as the melamine compound.

Chemical Formula 7

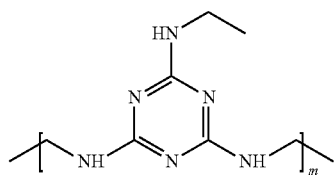

In Chemical Formula 7, m is an integer from 1 to 100.

In another embodiment, the melamine compound may include a compound represented by the Chemical Formula 8.

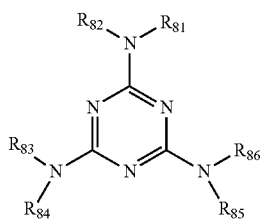

Chemical Formula 8

In Chemical Formula 8, $R_{81}$, $R_{82}$, $R_{83}$, $R_{84}$, $R_{85}$ and $R_{86}$ are each independently a substituted or unsubstituted linear or cyclic hydrocarbon group having 1 to 30 carbon atoms.

Another exemplary embodiment provides a paint composition.

The paint composition according to another embodiment includes a coating composition and a paint. For example, the paint composition according to an embodiment includes a coating composition in an amount of 100 parts by weight and a paint in an amount of about 5 parts by weight to about 10 parts by weight with respect to the 100 parts by weight of the coating composition.

The coating composition includes, with respect to a total weight of the coating composition, an epoxy resin in an amount of about 75 wt % to about 80 wt %, an isocyanate compound in an amount of about 10 wt % to about 15 wt %, and a melamine compound in an amount of about 5 wt % to about 10 wt %. Since the coating composition has already been described, a detailed description of the coating composition will be omitted below in order to avoid duplication.

There is no particular limitation on the type of the paint. The paint imparts color, tone and aesthetics to the coating film. The kind of paint may be determined according to the user's choice.

For example, any suitable, for example commercially available, pigments, dyes, or the like may be used as the paint without limitation.

Still another embodiment provides a coating panel 101.

FIG. 1 is a cross-sectional view illustrating a coating panel 101 according to an embodiment.

The coating panel 101 includes a base substrate 110, a first coating film 120 disposed on the base substrate 110 and including a first coating composition, and a second coating film 130 disposed on the first coating film 120 and including a second coating composition.

The base substrate 110 may include a metal or a non-metal. In another embodiment, the base substrate 110 may include a ferrous metal or a non-ferrous metal. In still another embodiment, the base substrate 110 may include a glass, a plastic, or the like.

According to still another embodiment, the base substrate 110 may include a stainless steel.

The first coating film 120 is a layer that contacts, for example is on or directly on, the base substrate 110 and is also referred to as a primer layer. The second coating film 130 can be a layer formed on, for example directly on, the first coating film 120 and may be referred to as a color layer. Although according to an embodiment the second coating film 130 does not contain a paint, the coating film formed on the primer layer is still called a color layer.

The first coating film 120 and the second coating film 130 may have substantially the same thickness or have different thicknesses. According to still another embodiment, the first coating film 120 and the second coating film 130 may each independently have a thickness of about 10 micrometers (μm) to about 15 μm. However, the thicknesses of the first coating film 120 and the thickness of the second coating film 130 are not limited thereto.

Generally, the first coating film 120 can serve to improve corrosion resistance and surface smoothness, and to prevent moisture permeation to the base substrate 110. The second coating film 130 can serve to protect the first coating film 120, to improve the gloss, and to enhance the overall aesthetics.

The coating panel 101 according to still another embodiment has excellent durability and reliability against the external environment. For example, when the coating panel 101 is left for 96 hours under the conditions of a temperature of about 85° C. and a relative humidity of about 85%, peeling or cracking of the coating films 120 and 130 is minimized or does not occur. As described above, the first coating film 120 and the second coating film 130 are durable and have excellent adhesiveness to the base substrate 110.

The first coating composition of the first coating film 120 and the second coating composition of the second coating film 130 may be substantially the same as or different from each other. According to still another embodiment, the first coating composition and the second coating composition are substantially the same as each other.

The first coating composition includes, with respect to a total weight thereof, an epoxy resin in an amount of about 75 wt % to about 80 wt %, an isocyanate compound in an amount of about 10 wt % to about 15 wt %, and a melamine compound in an amount of about 5 wt % to about 10 wt %.

The second coating composition also can include, with respect to a total weight thereof, an epoxy resin in an amount of about 75 wt % to about 80 wt %, an isocyanate compound in an amount of about 10 wt % to about 15 wt %, and a melamine compound in an amount of about 5 wt % to about 10 wt %.

The epoxy resin and the isocyanate compound used for forming the first coating film 120 may be reactive to form a urethane bond. By this urethane bonding, the first coating film 120 may have a strong bonding force with the base substrate 110. Accordingly, the first coating film 120 can have a low brittleness, and the first coating film 120 can be prevented from being cracked or broken.

According to still another embodiment, the epoxy resin has a hydroxyl group (OH) and can react with an isocyanate compound to form a urethane bond.

The epoxy resin may include a bisphenol epoxy resin, for example a bisphenol A epoxy resin. For example, the epoxy resin may include a compound represented by the following Chemical Formula 1.

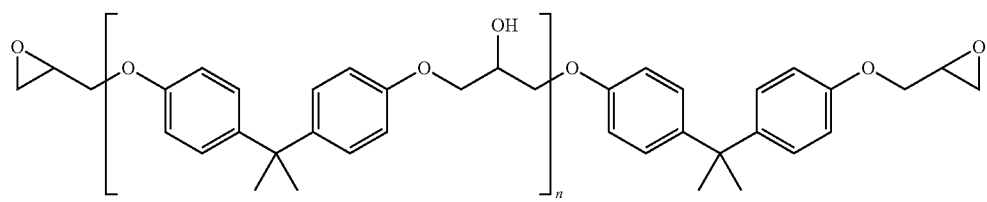

Chemical Formula 1

In Chemical Formula 1, n is an integer from 1 to 100.

In addition, a silane-modified epoxy resin may be used as the epoxy resin.

The isocyanate compound may include toluene diisocyanate (TDI), diphenylmethane 4,4'-diisocyanate (MDI), diphenylmethane 2,4' diisocyanate, hexamethylene diisocyanate (HDI), bis (4-isocyanatocyclohexyl) methane, isophorone diisocyanate (IPDI), or a combination comprising at least one of the foregoing.

In addition, the isocyanate compound may include an adduct of isocyanate. The adduct of isocyanate may include a compound represented by the following Chemical Formula 2, a compound represented by the following Chemical Formula 3, a compound represented by the following Chemical Formula 4, or a combination comprising at least one of the foregoing.

Chemical Formula 2

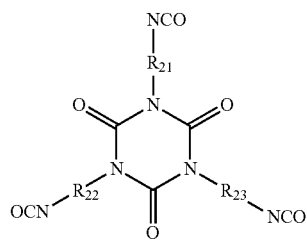

Chemical Formula 3

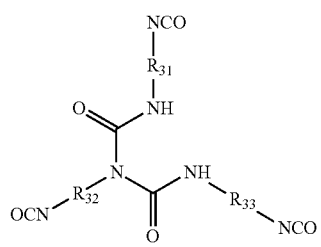

Chemical Formula 4

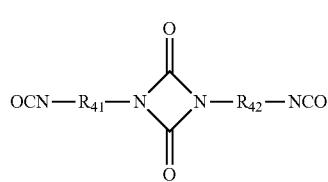

In Chemical Formulae 2, 3 and 4, $R_{21}$, $R_{22}$, $R_{23}$, $R_{31}$, $R_{32}$, $R_{33}$, $R_{41}$ and $R_{42}$ are each independently a substituted or unsubstituted linear or cyclic hydrocarbon group having 1 to 30 carbon atoms.

The isocyanate compound may include a compound represented by the Chemical Formula 5.

Chemical Formula 5

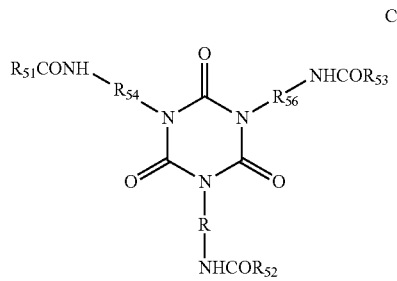

In Chemical Formula 5, $R_{51}$, $R_{52}$, $R_{53}$, $R_{54}$, and $R_{56}$ are each independently a substituted or unsubstituted linear or cyclic hydrocarbon group having 1 to 30 carbon atoms.

In another embodiment, the isocyanate compound may include a compound represented by the Chemical Formula 6.

Chemical Formula 6

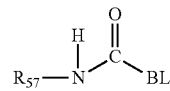

In Chemical Formula 6, BL is a phenol group, an ε-caprolactam group, or a butanone oxime group; and $R_{57}$ is a substituted or unsubstituted linear or cyclic hydrocarbon group having 1 to 30 carbon atoms.

The melamine compound may include a melamine resin represented by the Chemical Formula 7.

Chemical Formula 7

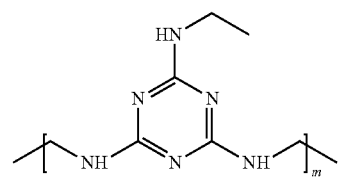

In Chemical Formula 7, m is an integer from 1 to 100.

In another embodiment, the melamine compound may include a compound represented by the Chemical Formula 8.

Chemical Formula 8

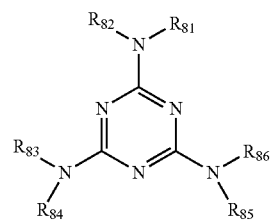

In Chemical Formula 8, $R_{81}$, $R_{82}$, $R_{83}$, $R_{84}$, $R_{85}$ and $R_{86}$ are each independently a substituted or unsubstituted linear or cyclic hydrocarbon group having 1 to 30 carbon atoms.

Figure 2:
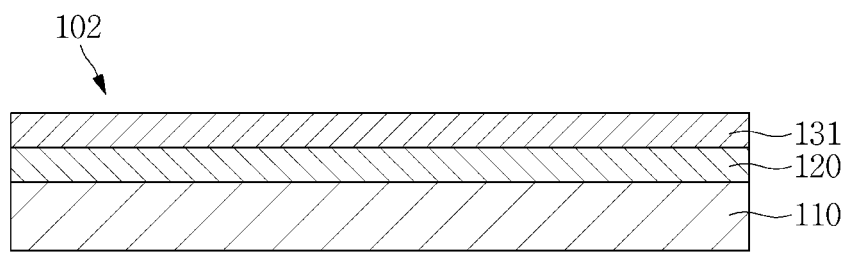
FIG. 2 is a cross-sectional view illustrating a coating panel according to another embodiment.

FIG. 2 is a cross-sectional view illustrating a coating panel 102 according to another embodiment.

The second coating film 131 of the coating panel 102 illustrated in FIG. 2 includes a paint and has a color. The second coating film 131 may include a second coating composition.

According to an embodiment, the second coating composition includes a first coating composition in an amount of 100 parts by weight; and a paint in an amount of about 5 parts by weight to about 10 parts by weight with respect to the 100 parts by weight of the first coating composition. As the paint, any suitable paint, including commercially available pigments, dyes and the like, may be used without limitation.

Yet another embodiment provides a display device 103.

Figure 3:
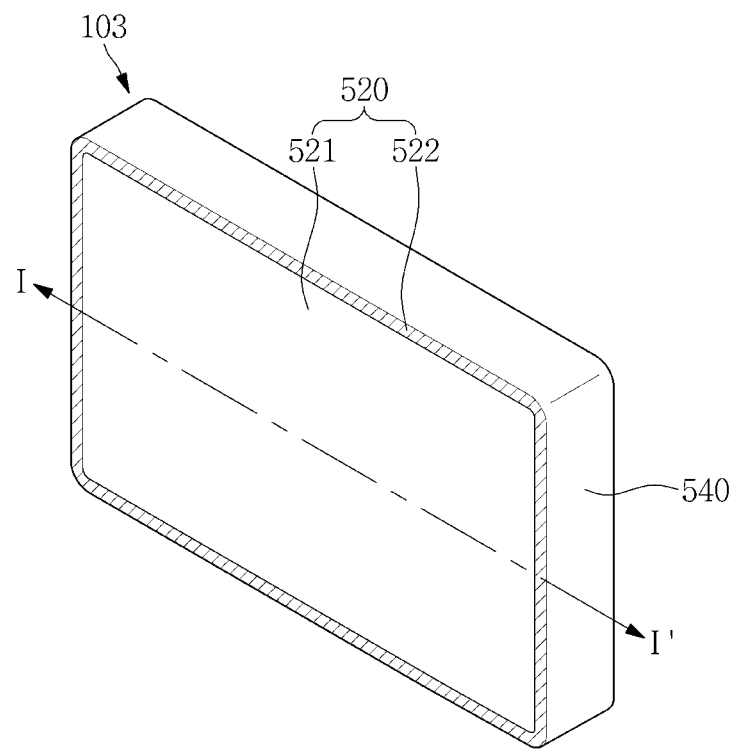
FIG. 3 is a perspective view illustrating a display device according to yet another embodiment.
Figure 4:
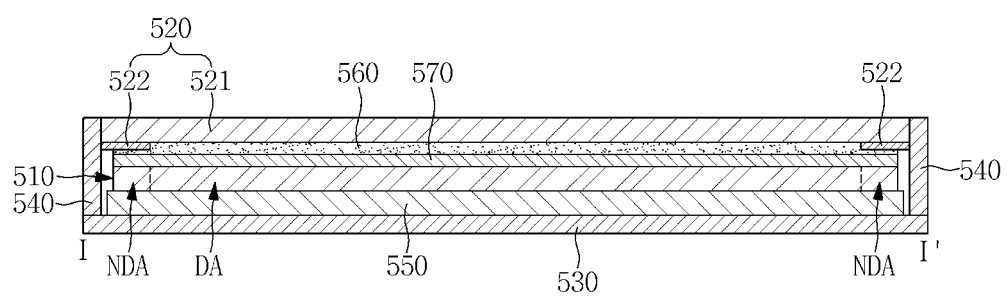
FIG. 4 is a cross-sectional view taken along line I-I' of FIG. 3.

FIG. 3 is a perspective view illustrating a display device 103 according to an embodiment, and FIG. 4 is a cross-sectional view taken along line I-I' of FIG. 3.

The display device 103 includes a display panel 510 and a chassis that includes a rear panel 530 and side panels 540 that protect the display panel 510. The chassis including the rear panel 530 and side panels 540 can include a coating panel as described herein. The rear panel 530 may be referred to as a bottom chassis, and the side panel 540 may be referred to as a side chassis.

Referring back to FIGS. 1 and 2, the coating panels forming the rear panel 530 and side panels 540 in FIGS. 3 and 4 can include a base substrate 110, a first coating film 120 disposed on the base substrate and including a first coating composition, and a second coating film 130 or 131 disposed on the first coating film 120 and each independently including a second coating composition.

The first coating composition includes, with respect to a total weight thereof, an epoxy resin in an amount of about 75 wt % to about 80 wt %, an isocyanate compound in an amount of about 10 wt % to about 15 wt %, and a melamine compound in an amount of about 5 wt % to about 10 wt %. Each of the second coating compositions may independently be the same as or different from the first coating composition.

The display panel 510 includes a display area DA and a non-display area NDA. The display area DA is a portion where an image is displayed. The non-display area NDA is a portion where no image is displayed, and may have a shape surrounding the display area DA, for example. Examples of the display panel 510 may include a liquid crystal display panel and an organic light emitting diode display panel.

In addition, the display device 103 may include a window panel 520.

The window panel 520 includes a base member 521 and a bezel portion 522 disposed on at least a portion of the base member 521.

The base member 521 may include a light transmissive member such as glass, plastic, or the like. The bezel portion 522 is disposed to overlap the non-display area NDA of the display panel 510. The bezel portion 522 is an opaque layer and blocks light.

In addition, the display device 103 may include a support member 550. The support member 550 may be, for example, a cushion member, but is not limited thereto. Materials for driving the display panel 510, for example, a battery (not shown), may be disposed on the support member 550.

In an embodiment, a touch panel 570 and an adhesive layer 560 may be disposed between the display panel 510 and the window panel 520.

Figure 5:
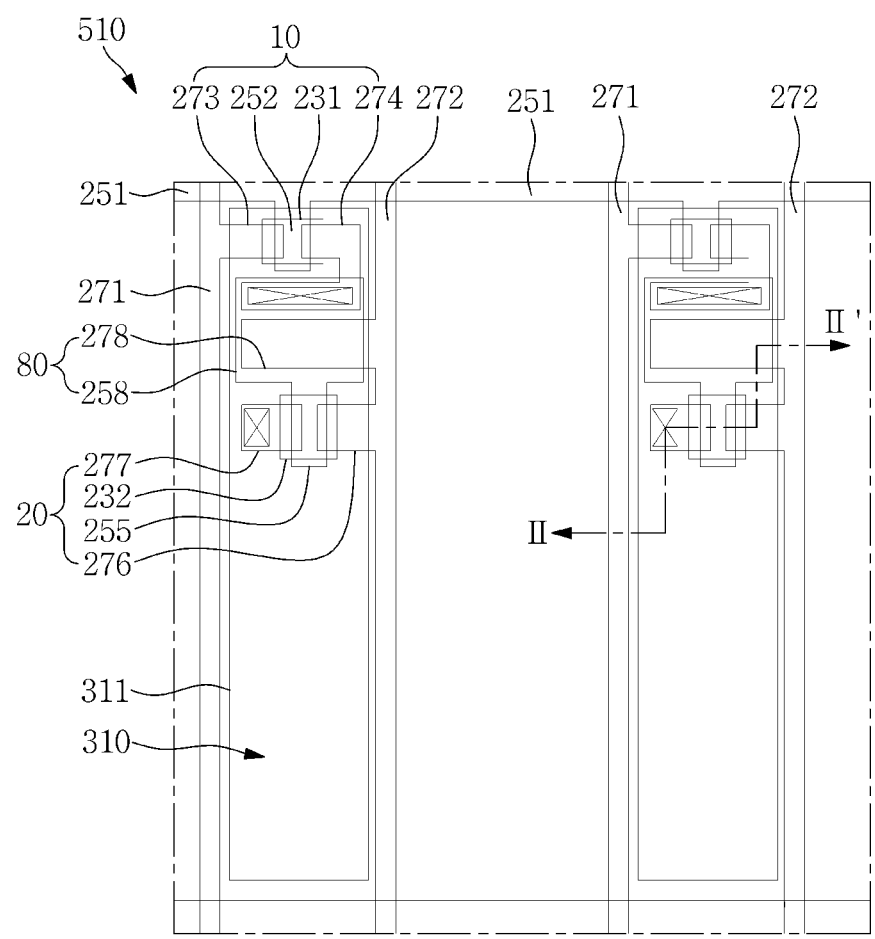
FIG. 5 is a plan view illustrating a pixel arrangement of a display panel according to yet another embodiment.
Figure 6:
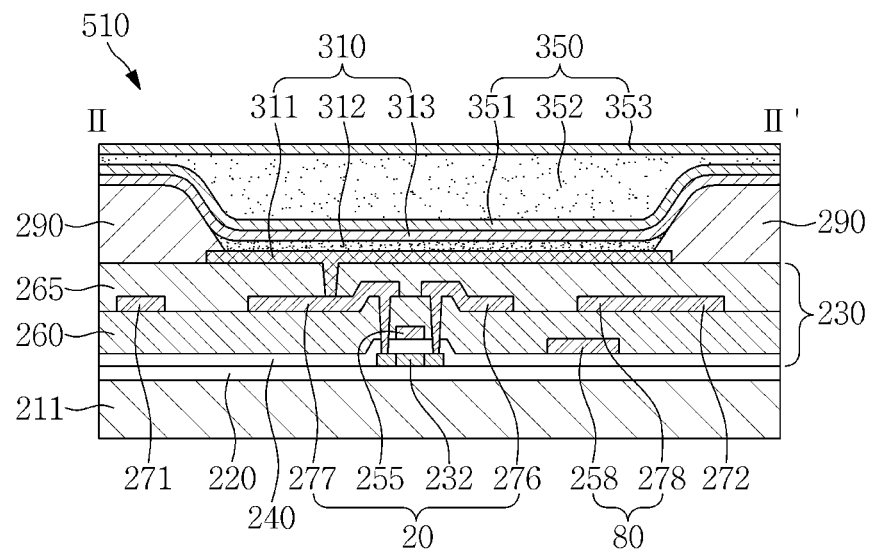
FIG. 6 is a sectional view taken along line II-II' of FIG. 5.

FIG. 5 is a plan view illustrating a pixel arrangement of the display panel 510 according to yet another embodiment, and FIG. 6 is a sectional view taken along line II-II' of FIG. 5.

The display panel 510 illustrated in FIGS. 5 and 6 can be an organic light emitting diode ("OLED") display panel. The OLED display panel includes a first substrate 211, a driving circuit unit 230 and an OLED 310.

The first substrate 211 may include an insulating material selected from the group consisting of: glass, quartz, ceramic, plastic, or the like. A polymer film may be used as the first substrate 211.

A buffer layer 220 is disposed on the first substrate 211. The buffer layer 220 may include one or more layers selected from various inorganic layers and organic layers. The buffer layer 220 may be omitted.

The driving circuit unit 230 is disposed on the buffer layer 220 between the first substrate 211 and the driving circuit unit 230. The driving circuit unit 230 includes a plurality of thin film transistors ("TFTs") 10 and 20 and drives the OLED 310. That is, the OLED 310 emits light according to a driving signal applied from the driving circuit unit 230, such that an image may be displayed.

FIGS. 5 and 6 illustrate an active matrix-type organic light emitting diode (AMOLED) display panel having a 2Tr-1Cap structure. For example, the 2Tr-1Cap structure may include two TFTs, e.g., a switching TFT 10 and a driving TFT 20, and one capacitor 80 in each pixel, but embodiments are not limited thereto. For example, the OLED display panel may include three or more TFTs and two or more capacitors in each pixel, and may further include additional wirings. Herein, the term "pixel" refers to a smallest unit for displaying an image, and the OLED display panel displays an image using a plurality of pixels.

Each pixel PX includes the switching TFT 10, the driving TFT 20, the capacitor 80, and the OLED 310. In addition, a gate line 251 extending along one direction, and a data line 271 and a common power line 272 insulated from and intersecting the gate line 251 are also provided at the driving circuit unit 230. Each pixel PX may be defined by the gate line 251, the data line 271, and the common power line 272 as a boundary, but embodiments are not limited thereto. The pixels PX may be defined by a pixel defining layer 290 or a black matrix. For example, the display panel 510 illustrated in FIG. 5 includes two pixels PX.

The OLED 310 includes a first electrode 311, an organic light emitting layer 312 disposed on the first electrode 311, and a second electrode 313 disposed on the organic light emitting layer 312. The organic light emitting layer 312 includes a low molecular weight organic material or a high molecular weight organic material. Holes and electrons are injected into the organic light emitting layer 312 from the first electrode 311 and the second electrode 313, respectively, and combined therein to form an exciton. The OLED 310 emits light when the exciton falls (i.e., radiatively decays) from an excited state to a ground state.

The capacitor 80 includes a pair of capacitor plates 258 and 278, having an insulating interlayer 260 interposed therebetween. In such an embodiment, the insulating interlayer 260 may be a dielectric element. A capacitance of the capacitor 80 is determined by electric charges accumulated in the capacitor 80 and a voltage across the pair of capacitor plates 258 and 278.

The switching TFT 10 includes a switching semiconductor layer 231, a switching gate electrode 252, a switching source electrode 273 and a switching drain electrode 274. The driving TFT 20 includes a driving semiconductor layer 232, a driving gate electrode 255, a driving source electrode 276 and a driving drain electrode 277. A gate insulating layer 240 is further provided to insulate the semiconductor layers 231 and 232 and the gate electrodes 252 and 255.

The switching TFT 10 may function as a switching element which selects a pixel to perform light emission. The switching gate electrode 252 is connected to the gate line 251, and the switching source electrode 273 is connected to the data line 271. Spaced apart from the switching source electrode 273, the switching drain electrode 274 is connected to one of the capacitor plates, e.g., the capacitor plate 258.

The driving TFT 20 applies a driving power, which allows an organic light emitting layer 312 of an OLED 310 in a selected pixel to emit light, to the first electrode 311 which is a pixel electrode PE. The driving gate electrode 255 is connected to said one capacitor plate 258 that is connected to the switching drain electrode 274. Each of the driving source electrode 276 and the other of the capacitor plates, e.g., the capacitor plate 278, is connected to the common power line 272. The driving drain electrode 277 is connected to the first electrode 311 of the OLED 310 through a contact hole defined in a planarization layer 265.

With the above-described structure, the switching TFT 10 is driven based on a gate voltage applied to the gate line 251 and serves to transmit a data voltage applied to the data line 271 to the driving TFT 20. A voltage equivalent to a difference between a common voltage applied to the driving TFT 20 from the common power line 272 and the data voltage transmitted by (or from) the switching TFT 10 is stored in the capacitor 80, and a current corresponding to the voltage stored in the capacitor 80 flows to the OLED 310 through the driving TFT 20 such that the OLED 310 may emit light.

The first electrode 311 may be a transmissive electrode having light transmittance or a reflective electrode having light reflectivity. The second electrode 313 may include a semi-transmissive layer or a reflective layer.

Referring to FIG. 6, the first electrode 311 is a reflective electrode and the second electrode 313 is a semi-transmissive electrode. A light generated in the organic light emitting layer 312 is emitted through the second electrode 313. However, embodiments are not limited thereto. For example, the first electrode 311 may be a light transmissive electrode, the second electrode 313 may be a reflective electrode, and a light generated in the organic light emitting layer 312 may be emitted through the first electrode 311.

At least one of a hole injection layer HIL and a hole transporting layer HTL may further be provided between the first electrode 311 and the organic light emitting layer 312, and at least one of an electron transporting layer ETL and an electron injection layer EIL may further be provided between the organic light emitting layer 312 and the second electrode 313 (not shown). The organic light emitting layer 312, the hole injection layer HIL, the hole transporting layer HTL, the electron transporting layer ETL, and the electron injection layer EIL may include an organic material, and thus may be referred to as an organic layer.

The pixel defining layer 290 can have an aperture (not shown). The aperture of the pixel defining layer 290 exposes a portion of the first electrode 311. The organic light emitting layer 312 and the second electrode 313 are sequentially stacked on the first electrode 311 exposed from the pixel defining layer 290. In such an embodiment, the second electrode 313 may also be formed on the pixel defining layer 290 as well as on the organic light emitting layer 312. The OLED 310 emits light from the organic light emitting layer 312 in the aperture of the pixel defining layer 290. As such, the pixel defining layer 290 may define a light emission area.

A capping layer (not illustrated) may be provided on the second electrode 313 to protect the OLED 310 from the external environment.

Referring to FIG. 6, a thin film encapsulation layer 350 is disposed on the second electrode 313.

The thin film encapsulation layer 350 includes one or more inorganic layers 351 and 353 and at least one organic layer 352, and substantially prevents outside atmosphere such as moisture or oxygen from permeating into the OLED 310.

The thin film encapsulation layer 350 may have a structure in which the inorganic layers 351 and 353 and the organic layer 352 are alternately stacked. In FIG. 6, the thin film encapsulation layer 350 includes two inorganic layers 351 and 353 and one organic layer 352, but the structure of the thin film encapsulation layer 350 is not limited thereto.

Each of the inorganic layers 351 and 353 may include one or more inorganic materials including $Al_2O_3$, $TiO_2$, ZrO, $SiO_2$, AlON, AlN, SiON, $Si_3N_4$, ZnO, $Ta_2O_5$, or a combination comprising at least one of the foregoing. The inorganic layers 351 and 353 may be formed through methods such as a chemical vapor deposition (CVD) method or an atomic layer deposition (ALD) method. However, embodiments are not limited thereto, and the inorganic layers 351 and 353 may be formed using various methods, including those known to those skilled in the art.

The organic layer 352 may include a polymer material. Examples of the polymer material may include, for example, an acrylic resin, an epoxy resin, polyimide, polyethylene, or a combination comprising at least one of the foregoing. In addition, the organic layer 352 may be formed through a thermal deposition process. The thermal deposition process for forming the organic layer 352 may be performed in a temperature range that does not damage the OLED 310. However, embodiments are not limited thereto, and the organic layer 352 may be formed using various methods, including those known to those skilled in the pertinent art.

The inorganic layers 351 and 353 which have a high density of thin layer may prevent or efficiently reduce infiltration of, mostly, moisture or oxygen. Permeation of moisture and oxygen into the OLED 310 may be largely prevented by the inorganic layers 351 and 353.

Moisture and oxygen that have passed through the inorganic layer 353 may further be blocked by the organic layer 352. The organic layer 352 may also serve as a buffer layer to reduce stress between the respective inorganic layers 351 and 353, in addition to the moisture-infiltration preventing function. Further, since the organic layer 352 has planarization characteristics, an uppermost surface of the thin film encapsulation layer 350 may be planarized by the organic layer 352.

The thin film encapsulation layer 350 may have a small thickness. Accordingly, the OLED display panel may also have a small thickness. By applying the thin film encapsulation layer 350 in such a manner, the OLED display panel may have flexible characteristics.

Figure 7:
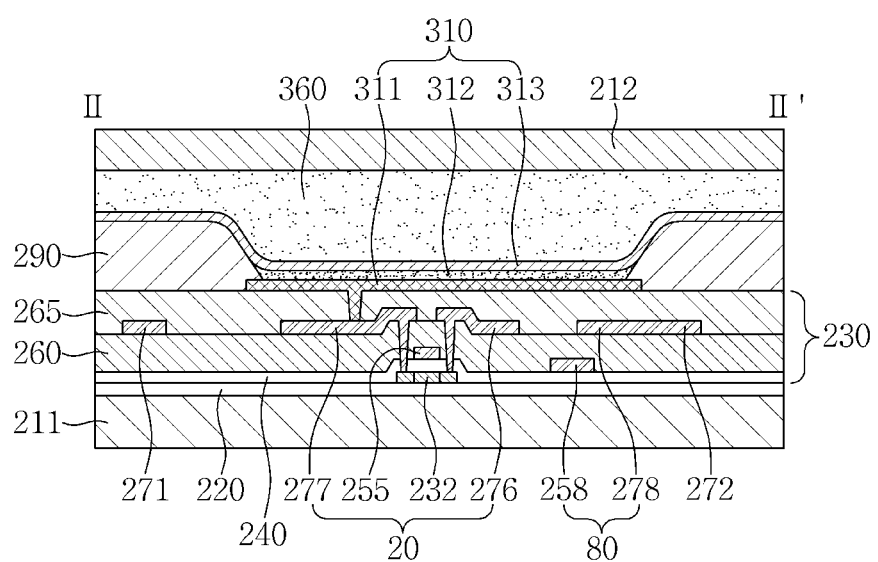
FIG. 7 is a cross-sectional view illustrating a display panel according to an alternative embodiment.

FIG. 7 is a cross-sectional view illustrating a display panel according to an alternative embodiment.

Referring to FIG. 7, a second substrate 212 is disposed on a second electrode 313 in order to protect an OLED 310. The second substrate 212 serves to seal the OLED 310 together with a first substrate 211. The second substrate 212, similar to the first substrate 211, may include an insulating material selected from the group consisting of; glass, quartz, ceramic, plastic, or the like. In addition, a filler 360 may be disposed between the OLED 310 and the second substrate 212.

Figure 8:
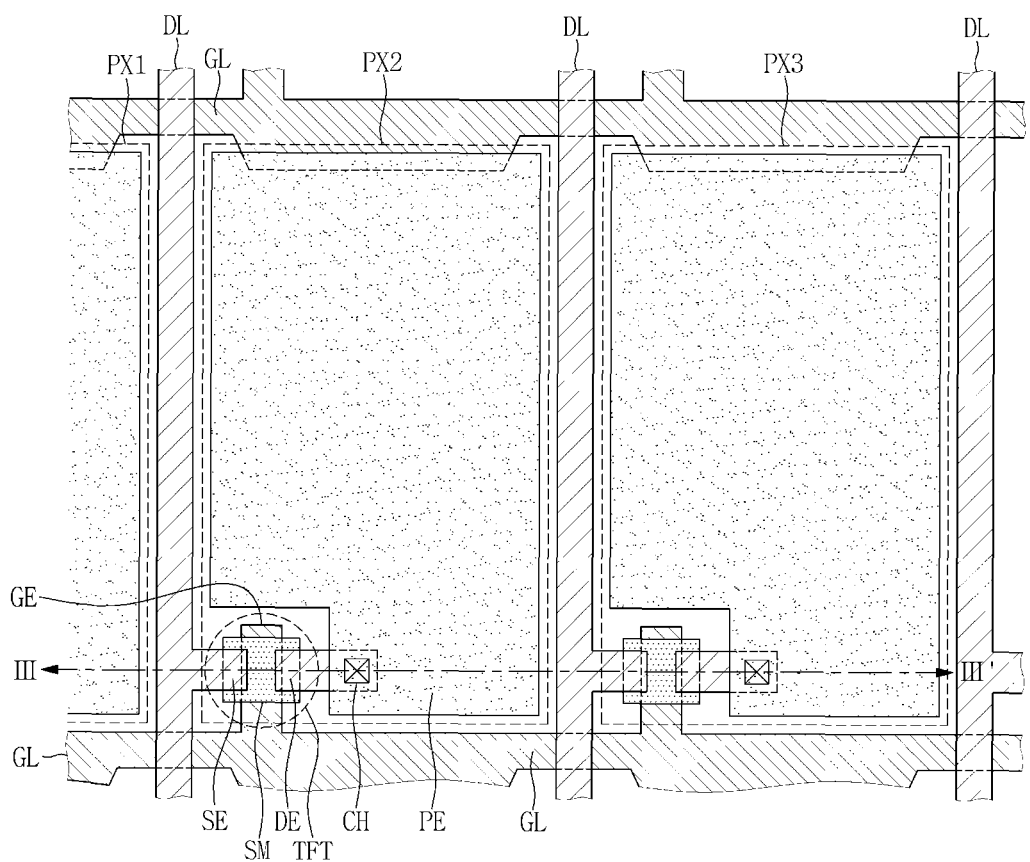
FIG. 8 is a plan view illustrating a pixel arrangement of a display panel according to still yet another embodiment.
Figure 9:
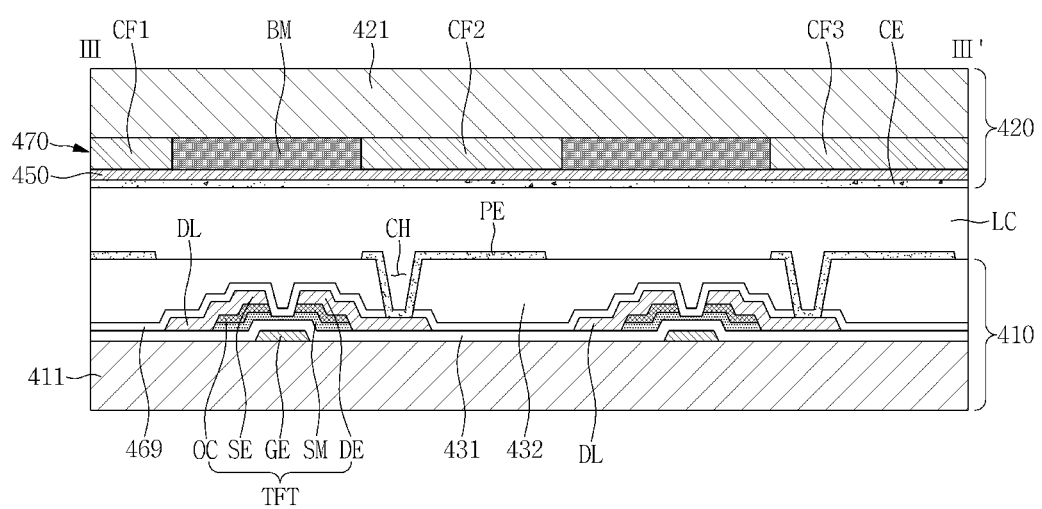
FIG. 9 is a cross-sectional view taken along line of FIG. 8.

FIG. 8 is a plan view illustrating a pixel arrangement of a display panel according to still another embodiment, and FIG. 9 is a cross-sectional view taken along line of FIG. 8. In detail, FIGS. 8 and 9 illustrate a liquid crystal display ("LCD") panel.

The LCD panel illustrated in FIGS. 8 and 9 includes a display substrate 410, an opposing substrate 420, and a liquid crystal layer LC between the display substrate 410 and the opposing substrate 420.

The display substrate 410 includes a first substrate 411, a TFT, a pixel electrode PE, a gate insulating layer 431 and a protective layer 432. The TFT includes a semiconductor layer SM, an ohmic contact layer OC, a gate electrode GE, a source electrode SE and a drain electrode DE.

The first substrate 411 may include transparent materials such as glass or plastic.

A plurality of gate lines GL and gate electrodes GE are disposed on the first substrate 411. The gate electrode GE is connected to the gate line GL. The gate line GL and the gate electrode GE may include or be formed of aluminum (Al) or alloys thereof, silver (Ag) or alloys thereof, copper (Cu) or alloys thereof, molybdenum (Mo) or alloys thereof, chromium (Cr), tantalum (Ta), titanium (Ti), or a combination comprising at least one of the foregoing. At least one of the gate line GL and the gate electrode GE may have a multi-layer structure including at least two conductive layers that have different physical properties.

The gate insulating layer 431 is disposed over an entire surface of the first substrate 411 including the gate line GL and the gate electrode GE. The gate insulating layer 431 may include, for example, silicon nitride ($SiN_x$) or silicon oxide ($SiOx$). In addition, the gate insulating layer 431 may have a multilayer structure including at least two insulating layers having different physical properties.

The semiconductor layer SM is disposed on the gate insulating layer 431. In such an embodiment, the semiconductor layer SM overlaps the gate electrode GE below the gate insulating layer 431. The semiconductor layer SM may include amorphous silicon, polycrystalline silicon, or the like. The semiconductor layer SM may include an oxide semiconductor.

The ohmic contact layer OC is disposed on the semiconductor layer SM. For example, the ohmic contact layer OC is disposed on the semiconductor layer SM other than a channel area. The ohmic contact layer OC may be omitted.

Further, a plurality of data lines DL are disposed on the gate insulating layer 431. The data lines DL intersect the gate lines GL. The source electrode SE is connected to a data line DL, and is disposed on the ohmic contact layer OC. The drain electrode DE, spaced apart from the source electrode SE, is disposed on the ohmic contact layer OC and connected to the pixel electrode PE.

At least one of the data line DL, the source electrode SE and the drain electrode DE may include or be formed of a refractory metal, such as molybdenum, chromium, tantalum, and titanium, or an alloy thereof. Further, at least one of the data line DL, the source electrode SE and the drain electrode DE may have a multilayer structure including a refractory metal layer and a low-resistance conductive layer.

An insulating interlayer 469 is disposed over the surface, for example the entire surface, of the first substrate 411 including the gate insulating layer 431, the semiconductor layer SM, the data line DL, the source electrode SE and the drain electrode DE. The insulating interlayer 469 may include an insulating material, and in particular, protect the channel area, an exposed portion, of the semiconductor layer SM.

The protective layer 432 is disposed on the insulating interlayer 469. The protective layer 432 serves to planarize an upper portion the TFT. Accordingly, the protective layer 432 is also referred to as a flattening layer.

The protective layer 432 may include an inorganic insulating material such as silicon nitride ($SiNx$) or silicon oxide ($SiOx$). In an alternative embodiment, the protective layer 432 may include an organic layer. In another alternative embodiment, the protective layer 432 may have a double-layer structure including a lower inorganic layer and an upper organic layer.

The pixel electrode PE is disposed on the protective layer 432. In such an embodiment, the pixel electrode PE is connected to the drain electrode DE through a contact hole CH defined through the protective layer 432 and the insulating interlayer 469. The pixel electrode PE may include a transparent conductive material such as indium tin oxide (ITO) or indium zinc oxide (IZO).

The opposing substrate 420 includes a second substrate 421, a color filter layer 470, and a common electrode CE.

The second substrate 421 includes transparent materials such as glass or plastic.

The light blocking portion BM is disposed on the second substrate 421. The light blocking portion BM has a plurality of openings. The openings are defined corresponding to respective pixel electrodes PE of first, second and third pixels PX1, PX2 and PX3. The light blocking portion BM blocks light in portions other than the openings. For example, the light blocking portion BM is disposed on a region overlaying the TFT, the gate line GL, and the data line DL to block light from passing therethrough and being directed outwards. The light blocking portion BM is not invariably necessary, and may be omitted.

The color filter layer 470 is disposed on the second substrate 421 and selectively blocks a wavelength of a light incident from a backlight unit (not illustrated).

The color filter layer 470 may include a first color filter CF1, a second color filter CF2, and a third color filter CF3.

The first, second, and third color filters CF1, CF2, and CF3 may be distinguished from each other by the light blocking portion BM. Referring to FIGS. 8 and 9, respective ones of the color filters CF1, CF2, and CF3 may be disposed so as to overlap the pixels PX1, PX2, and PX3. The first, second, and third color filters CF1, CF2, and CF3 may represent any one of red, green, or blue colors. The color filter layer 470 may include a white color filter (not shown) and may include a color filter having a color other than red, green, or blue.

The passivation layer 450 may be disposed between the color filter layer 470 and the common electrode CE. The passivation layer 450 optionally may be omitted.

The common electrode CE is disposed on the passivation layer 450. For example, the common electrode CE may be disposed over an entire surface of the second substrate 421. The common electrode CE may include a transparent conductive material such as ITO or IZO.

However, embodiments are not limited thereto, and the common electrode CE may be disposed on the first substrate 411 to be a component of the display substrate 410.

The common electrode CE, along with the pixel electrode PE, applies an electric field over the liquid crystal layer LC.

Although not illustrated, a lower alignment layer may be disposed on the pixel electrode PE. The lower alignment layer may be a vertical alignment layer, and may include a photoreactive material. Similar to the lower alignment layer, although not illustrated, an upper alignment layer may be disposed on the common electrode CE. The upper alignment layer may include a substantially same material as that included in the lower alignment layer.

When facing surfaces of the first substrate 411 and the second substrate 421 are defined as upper surfaces of the corresponding substrates and surfaces on opposite sides of the upper surfaces are respectively defined as lower surfaces of the corresponding substrates, polarizers may be disposed on the lower surface of the first substrate 411 and the lower surface of the second substrate 421, respectively.

As set forth hereinabove, according to one or more embodiments, the coating composition includes an epoxy resin and a relatively small amount of a melamine compound and a relatively large amount of an isocyanate compound. Accordingly, the coating composition may form a coating film having excellent adhesiveness and strength and low brittleness.

While one or more embodiments have been illustrated and described with reference to the figures, it will be understood by those of ordinary skill in the art that various changes in form and details may be made thereto without departing from the spirit and scope as defined by the following claims.

What is claimed is:

1. A coating composition comprising:
an epoxy resin in an amount of about 75 weight percent to about 80 weight percent;
an isocyanate compound in an amount of about 10 weight percent to about 15 weight percent; and
a melamine compound in an amount of about 5 weight percent to about 10 weight percent,
where all weight percents are based on a total weight of the coating composition, and
wherein the melamine compound comprises a compound represented by the following Chemical Formula 7:

Chemical Formula 7

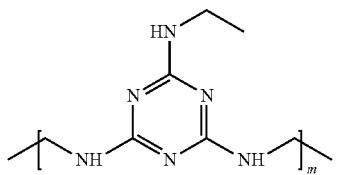

wherein, m is an integer from 1 to 100.

2. The coating composition as claimed in claim 1, wherein the epoxy resin and the isocyanate compound are reactive to form a urethane bond.

3. The coating composition as claimed in claim 1, wherein the epoxy resin comprises a bisphenol epoxy resin.

4. The coating composition as claimed in claim 1, wherein the epoxy resin comprises a compound represented by the following Chemical Formula 1:

Chemical Formula 1

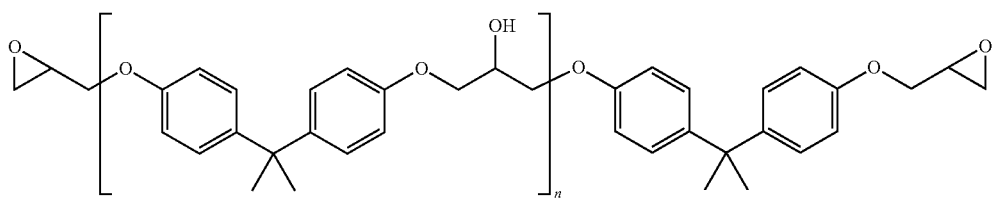

wherein, n is an integer from 1 to 100.

5. The coating composition as claimed in claim 1, wherein the isocyanate compound comprises toluene diisocyanate, diphenylmethane 4,4'-diisocyanate, diphenylmethane 2,4' diisocyanate, hexamethylene diisocyanate, bis (4-isocyanatocyclohexyl) methane, isophorone diisocyanate (IPDI), or a combination comprising at least one of the foregoing.

6. The coating composition as claimed in claim 1, wherein the isocyanate compound comprises an adduct of isocyanate.

7. The coating composition as claimed in claim 6, wherein the adduct of isocyanate comprises a compound represented by the following Chemical Formula 2, a compound represented by the following Chemical Formula 3, a compound represented by the following Chemical Formula 4, or a combination comprising at least one of the foregoing:

Chemical Formula 2

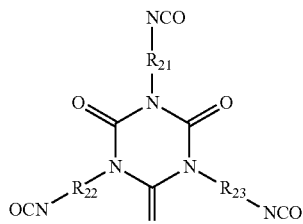

Chemical Formula 3

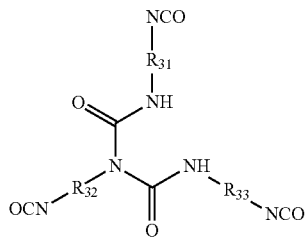

Chemical Formula 4

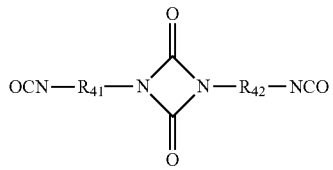

wherein, $R_{21}$, $R_{22}$, $R_{23}$, $R_{31}$, $R_{32}$, $R_{33}$, $R_{41}$ and $R_{42}$ are each independently a substituted or unsubstituted linear or cyclic hydrocarbon group having 1 to 30 carbon atoms.

8. The coating composition as claimed in claim 1, wherein the isocyanate compound comprises a compound represented by the following Chemical Formula 5:

Chemical Formula 5

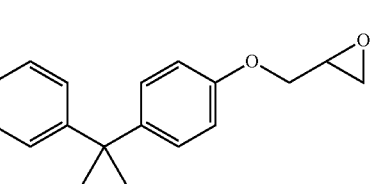

wherein, $R_{51}$, $R_{52}$, $R_{53}$, $R_{54}$, R, and $R_{56}$ are each independently a substituted or unsubstituted linear or cyclic hydrocarbon group having 1 to 30 carbon atoms.

9. The coating composition as claimed in claim 1, wherein the isocyanate compound comprises a compound represented by the following Chemical Formula 6:

Chemical Formula 6

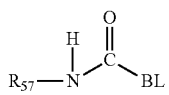

wherein, BL is a phenol group, an ε-caprolactam group, or a butanone oxime group; and $R_{57}$ is a substituted or unsubstituted linear or cyclic hydrocarbon group having 1 to 30 carbon atoms.

10. The coating composition as claimed in claim 1, wherein the melamine compound further comprises a compound represented by the following Chemical Formula 8:

Chemical Formula 8

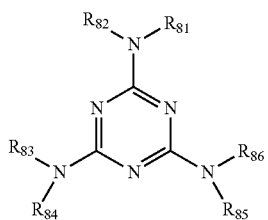

wherein, $R_{81}$, $R_{82}$, $R_{83}$, $R_{84}$, $R_{85}$ and $R_{86}$ are each independently a substituted or unsubstituted linear or cyclic hydrocarbon group having 1 to 30 carbon atoms.

11. A paint composition comprising:
a coating composition in an amount of 100 parts by weight; and
a paint in an amount of about 5 parts by weight to about 10 parts by weight with respect to the 100 parts by weight of the coating composition,
wherein the coating composition comprises:
an epoxy resin in an amount of about 75 weight percent to about 80 weight percent;
an isocyanate compound in an amount of about 10 weight percent to about 15 weight percent; and
a melamine compound in an amount of about 5 weight percent to about 10 weight percent,
where all weight percents are based on a total weight of the coating composition, and
wherein the melamine compound comprises a compound represented by the following Chemical Formula 7:

Chemical Formula 7

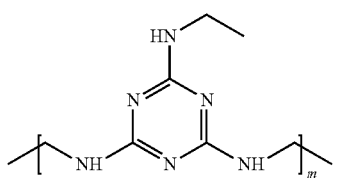

wherein, m is an integer from 1 to 100.

12. A coating panel comprising:
a base substrate;
a first coating film disposed on the base substrate and comprising a first coating composition; and
a second coating film disposed on the first coating film and comprising a second coating composition,
wherein the first coating composition comprises:
an epoxy resin in an amount of about 75 weight percent to about 80 weight percent;
an isocyanate compound in an amount of about 10 weight percent to about 15 weight percent; and
a melamine compound in an amount of about 5 weight percent to about 10 weight percent,
where all weight percents are based on a total weight of the first coating composition, and
wherein the melamine compound comprises a compound represented by the following Chemical Formula 7:

Chemical Formula 7

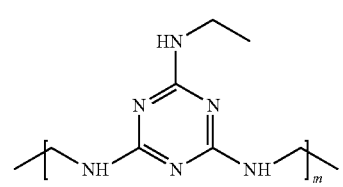

wherein, m is an integer from 1 to 100.

13. The coating panel as claimed in claim 12, wherein the base substrate comprises stainless steel.

14. The coating panel as claimed in claim 12, wherein the second coating composition is substantially the same as the first coating composition.

15. The coating panel as claimed in claim 14, wherein the second coating composition comprises:
the first coating composition in an amount of 100 parts by weight; and
a paint in an amount of about 5 parts by weight to about 10 parts by weight with respect to the 100 parts by weight of the first coating composition.

16. The coating panel as claimed in claim 12, wherein the epoxy resin and the isocyanate compound are reactive to form a urethane bond.

17. The coating panel as claimed in claim 12, wherein the epoxy resin comprises a bisphenol epoxy resin.

18. The coating panel as claimed in claim 12, wherein the epoxy resin comprises a compound represented by the following Chemical Formula 1:

Chemical Formula 1

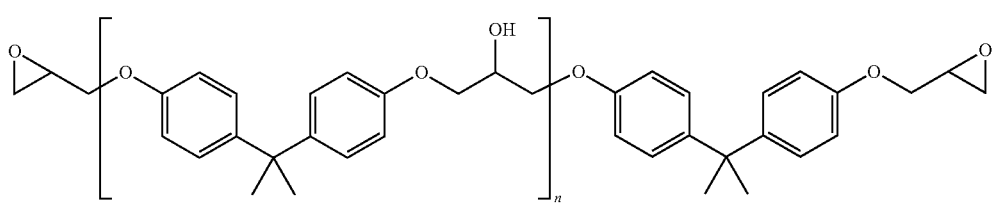

wherein, n is an integer from 1 to 100.

19. The coating panel as claimed in claim 12, wherein the isocyanate compound comprises toluene diisocyanate, diphenylmethane 4,4'-diisocyanate, diphenylmethane 2,4' diisocyanate, hexamethylene diisocyanate, bis (4-isocyanatocyclohexyl) methane, isophorone diisocyanate, or a combination comprising at least one of the foregoing.

20. The coating panel as claimed in claim 12, wherein the isocyanate compound comprises an adduct of isocyanate.

21. The coating panel as claimed in claim 20, wherein the adduct of isocyanate comprises a compound represented by the following Chemical Formula 2, a compound represented by the following Chemical Formula 3, a compound represented by the following Chemical Formula 4, or a combination comprising at least one of the foregoing:

Chemical Formula 2
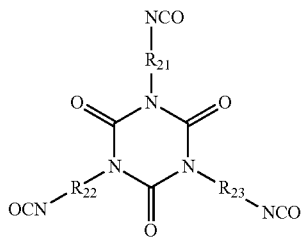

Chemical Formula 3
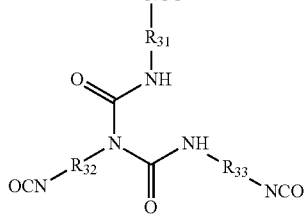

Chemical Formula 4
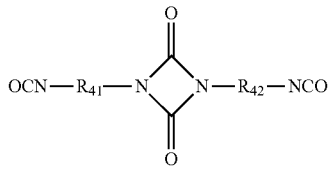

wherein, $R_{21}$, $R_{22}$, $R_{23}$, $R_{31}$, $R_{32}$, $R_{33}$, $R_{41}$ and $R_{42}$ are each independently a substituted or unsubstituted linear or cyclic hydrocarbon group having 1 to 30 carbon atoms.

22. The coating panel as claimed in claim 12, wherein the isocyanate compound comprises a compound represented by the following Chemical Formula 5:

Chemical Formula 5
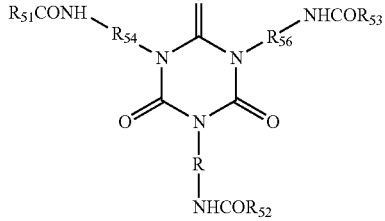

wherein, $R_{51}$, $R_{52}$, $R_{53}$, $R_{54}$, R, and $R_{56}$ are each independently a substituted or unsubstituted linear or cyclic hydrocarbon group having 1 to 30 carbon atoms.

23. The coating panel as claimed in claim 12, wherein the isocyanate compound comprises a compound represented by the following Chemical Formula 6:

Chemical Formula 6
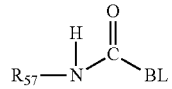

wherein, BL is a phenol group, an ε-caprolactam group, or a butanone oxime group; and $R_{57}$ is a substituted or unsubstituted linear or cyclic hydrocarbon group having 1 to 30 carbon atoms.

24. The coating panel as claimed in claim 12, wherein the melamine compound further comprises a compound represented by the following Chemical Formula 8:

Chemical Formula 8
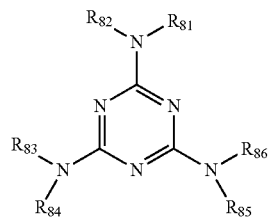

wherein, $R_{81}$, $R_{82}$, $R_{83}$, $R_{84}$, $R_{85}$ and $R_{86}$ are each independently a substituted or unsubstituted linear or cyclic hydrocarbon group having 1 to 30 carbon atoms.

25. A display device comprising:
a display panel; and
a chassis protecting the display panel and comprising a coating panel,
wherein the coating panel comprises:
a base substrate; and
a first coating film disposed on the base substrate and comprising a first coating composition,
a second coating film disposed on the first coating film and comprising a second coating composition, and
the first coating composition comprising:
an epoxy resin in an amount of about 75 weight percent to about 80 weight percent;
an isocyanate compound in an amount of about 10 weight percent to about 15 weight percent; and
a melamine compound in an amount of about 5 weight percent to about 10 weight percent,
where all weight percents are based on a total weight of the first coating composition, and
wherein the melamine compound comprises a compound represented by the following Chemical Formula 7:

Chemical Formula 7
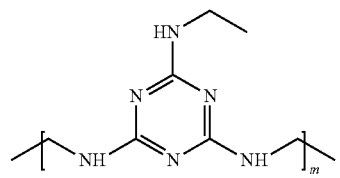

wherein, m is an integer from 1 to 100.

26. The display device as claimed in claim 25, wherein the display panel is a liquid crystal display panel.

27. The display device as claimed in claim 25, wherein the display panel is an organic light emitting diode display panel.

* * * * *